United States Patent [19]

Todd

[11] Patent Number: 5,862,364
[45] Date of Patent: Jan. 19, 1999

[54] DATA PROCESSING SYSTEM AND METHOD FOR GENERATING STATES OF A MODEL DEFINED WITHIN A MODELLING APPLICATION

[75] Inventor: Stephen James Paul Todd, Winchester, United Kingdom

[73] Assignee: International Business Machines Corp., Armonk, N.Y.

[21] Appl. No.: 688,592

[22] Filed: Jul. 30, 1996

[30] Foreign Application Priority Data

Aug. 3, 1995 [GB] United Kingdom ............... 9515962

[51] Int. Cl.[6] ................................... G06F 17/10
[52] U.S. Cl. .................... 395/500; 364/578; 707/511
[58] Field of Search ................ 395/500; 345/342, 345/348, 349, 350, 351; 707/511; 364/578

[56] References Cited

U.S. PATENT DOCUMENTS

| | | | |
|---|---|---|---|
| 5,278,979 | 1/1994 | Foster et al. ........................... | 707/511 |
| 5,280,574 | 1/1994 | Mizuta et al. ......................... | 707/511 |
| 5,357,631 | 10/1994 | Howell et al. ......................... | 707/511 |
| 5,438,661 | 8/1995 | Ogawa .................................. | 707/511 |
| 5,499,180 | 3/1996 | Ammirato et al. ................... | 707/511 |
| 5,555,410 | 9/1996 | Tsuchiya ............................... | 707/511 |
| 5,630,138 | 5/1997 | Raman .................................. | 707/511 |
| 5,655,130 | 8/1997 | Dodge et al. ......................... | 707/511 |

*Primary Examiner*—Kevin J. Teska
*Assistant Examiner*—Tyrone V. Walker
*Attorney, Agent, or Firm*—Gregory M. Doudnikoff

[57] ABSTRACT

Provided is a data processing system and a method for generating states of a model defined within a modelling application. The modelling application generates a state of the model based on the values of a number of input variables. A modification means alters the values of the input variables, and provides those altered values to the modelling application to cause a new state of the model to be generated. The modification means repeats the production of altered values such that a set of states of the model is generated. A display means produces a graphical representation of each state of the model in the set and displays the graphical representations on a display device. The system includes control means, responsive to signals received from an input device, to enable a user to select graphical representations from those displayed and to place the selected graphical representations in a predetermined area of the display device; and weighting means for automatically assigning a weighting to each graphical representation within the predetermined area, this weighting being dependant on the position of the graphical representation within the predetermined area. The modification means is responsive to the weighting of each state of the model to produce altered input variables for a subsequent set of states of the model. The generation of the set of states of the model and display of their graphical representations is then repeated.

14 Claims, 9 Drawing Sheets

DATA PROCESSING SYSTEM AND METHOD FOR GENERATING STATES OF A MODEL DEFINED WITHIN A MODELLING APPLICATION

BACKGROUND OF THE INVENTION

1. Field of the Invention

The present invention relates to a data processing system and method of operation, and in particular to a data processing system for generating states of a model defined within a modeling application.

2. Description of the Related Art

Typically such a data processing system will run a software application in which a model can be defined by a number of equations, variables and constants. For example a spreadsheet application could be used to model the financial state of a company over a number of years. The state of the model might depend on a large number of variables, and typically the model will be responsive to information used to alter those variables, and hence to alter the state of the model.

Likewise, running the modeling application might result in a number of financial and other predictions indicating the success or otherwise of the modeling process. The user will generally wish to change a number of the input variables to produce a good set of predictions. However this is not always a straightforward task for the user.

The user's difficulty generally arises from the need to remember how the model variables changed and the result of those changes, before the next set of changes can be made. Typically, graphs may be used to help in this visualization process, e.g. giving financial and market share results over a number of years. Even so, after a number of variable changes, the user's memory of the actual shape of the graphs will quickly fade, making it very difficult to choose the optimum direction to change the values of the input variables.

Existing prior art techniques, such as "What-if" programming, allow the user to adjust the input variables, or alternatively to instruct the modeling application how to do so, and the user then judges the various outputs produced. Even if these techniques are useful in many cases, it is almost impossible to use them when there are more than four or five input variables to be set up. It is difficult to keep track of past experiments, and the user gets distracted by the mechanism of setting up the variables or the instructions for the experiments.

Other techniques, such as those used in "solver" and "optimizer" tools of existing modeling applications, are not useful in situations where the user cannot readily define the result that he/she is trying to achieve; moreover they only produce a single value as a result and can only be defined by a mathematical equation.

European Patent Application EP 0,628,918 describes a "Mutator" technique for controlling the input variables of a standard or special purpose modeling application. The basic Mutator concept is to let the system randomly alter the input variables of the modeling application within predetermined limits, and to then provide the new input variables to the modeling application to generate a new state of the model. This process can be repeated a number of times to produce a series of mutated states of the model, the user then being presented with a visual representation of this series of "mutated" states of the model. Based on this, the user can then select the best of the representations for a subsequent iteration of the mutation process. The decision as to which representations are "best" is a subjective decision made by the user, and will be dependent on the overall state of the model that the user is aiming to achieve. The states corresponding to the representations selected by the user are referred to as "parents", whereas the states produced in a subsequent iteration of the mutation process are referred to as "children".

Various features are described in the above referenced European patent application to be employed by the user when selecting parent states for a subsequent iteration. One feature allows the user to flag some of the states of the model as "good" or "bad", and this judgement is then used to steer or bias the mutation. Another feature allows the user to select and 'marry' parent states to produce children that share characteristics of their parents. Typically, the user interacts with the mutation system by means of a selection device, such as a mouse, firstly selecting from a menu a characteristic, such as "good" or "bad", to be associated with subsequently selected representations, and then selecting the representations that the user considers to exhibit that characteristic, thereby associating that characteristic with the selected state(s). The user can then select another characteristic from the menu, and then make some further selections or modify one or more old selections. In this way the states selected as bad are discarded and disappear from the screen while the states selected as good are kept for use as parents in a subsequent iteration of the mutation process. Moreover, the user can apply weighting values to selected states, such as those state(s) selected as good. This would typically be done by selecting a weighting function from the menu and then clicking a number of times on such state(s), where the number of clicks on a particular representation equates to the weighting given to that state. According to the above prior art approach, the states selected as "good" would generally have an icon associated with them to indicate their selection, but would remain in their original position. Additionally numbers would be provided with the icons to indicate the weighting value given.

It is advantageous for the user to make use of the above features, since experience has indicated that the Mutator system operates most effectively when a user chooses several potential parents at each mutation step.

However, in spite of the above features facilitating a quicker generation of satisfactory mutated scenarios, they are not very easy or intuitive to use, and can be rather cumbersome. When the user is not only selecting parent states but also weighting (or "ranking") them, the above technique becomes particularly cumbersome, since the user has to select a weighting function and then revisit the selected states in order to apply the desired weighting to them. Indeed experience has shown that users often avoid using these separate features because of the user effort required.

SUMMARY OF THE INVENTION

Hence, it is an object of the present invention to provide a data processing system with an improved technique for generating states of a model within a standard or special purpose modeling application.

Accordingly the present invention provides a data processing system for generating states of a model, the model being defined within a modeling application and having a plurality of input variables associated therewith, the modeling application being arranged to generate a state of the model based on the values of the input variables, the system comprising: a modification means for altering the values of the input variables, and for providing those altered values to the modeling application to cause a new state of the model to be generated; the modification means being arranged to repeat a selected number of times the production of altered values thereby causing a set of states of the model to be generated by the modeling application; a display means for producing a graphical representation of each state of the model in the set and for displaying those graphical representations on a display device connectable to the system; the system being characterized by:

> the display means being arranged to display a plurality of the graphical representations in a predetermined area of the display device;
>
> input control means, responsive to signals received from an input device connectable to the system, to enable a user to select graphical representations from those displayed and to move the selected graphical representations into or from the predetermined area;
>
> re-arranging means, responsive to a user movement of a graphical representation from a first location on the display device to a second location on the display device, for re-arranging the graphical representations on the display device to allow the insertion and display of the graphical representation in the second location;
>
> the modification means being responsive to the values of the input variables of each state of the model represented by a graphical representation in the predetermined area of the display device, to produce altered input variables for a subsequent set of states of the model;
>
> the data processing system being arranged to repeat the generation of the set of states of the model, and to display graphical representations of those states.

Using the technique of the present invention, the user is encouraged to perform more selections of potential parents, thereby making more effective use of the mutator system. In fact, the system according to the invention automatically displays a plurality of graphical representations in the predetermined area, prior to any direct selection by the user; this urges the user to complete his/her choice if the automatic selection is not desired. Further, the mechanism provided in preferred embodiments of the present invention for moving representations assists the user in making selections, since the drag and drop process is intuitive and easy to use.

Additionally, in preferred embodiments of the present invention, the data processing system further comprises weighting means for automatically assigning a weighting to each graphical representation within the predetermined area, this weighting being dependent on the position of the graphical representation within the predetermined area; the modification means being also responsive to the weighting of each state of the model represented by a graphical representation in the predetermined area when producing said altered input variables. The physical proximity of the best choices in the predetermined area make it easier for the user to see the choices he/she has made, and to then reorder them to perform a ranking among them. In preferred embodiments, the weighting means automatically assigns a weighting to each graphical representation within the predetermined area each time a changing of the position of the graphical representations occurs within the predetermined area.

Preferably, when a graphical representation is moved from the first to the second location, the other graphical representations are re-arranged by shifting the graphical representations between the first location and the second location one location towards the first location, thereby making available the position corresponding to the second location for insertion and display of the graphical representation. Then, to improve the operational effectiveness of the system in preferred embodiments, the second location, if not within a gap, is automatically associated with the nearest gap, the gap being any free space between two graphical representations or between one graphical representation and the frame of the predetermined area. Typically, the second location to which a graphical representation is moved would be within the predetermined area.

Preferably, the weighting means automatically downgrades each graphical representation when it is moved out of the predetermined area. In addition, during a generation of a subsequent set of states, the selected graphical representations from the previous generation of states are retained in the predetermined area, thereby allowing comparison of the new states with the previously selected states.

Viewed from a second aspect, the present invention provides a method of operating a data processing system to generate states of a model, comprising the steps of:

> (a) storing the model in a modeling application, the model having a plurality of input variables associated therewith;
>
> (b) altering the values of the input variables and providing those altered values to the modeling application to cause a new state of the model to be generated, the state of the model being based on the values of the input variables, this step being repeated a selected number of times to cause a set of states of the model to be generated;
>
> (c) producing a graphical representation for each state of the model in the set;
>
> (d) displaying the graphical representations on a display device, a plurality of graphical representation being displayed in a predetermined area (300) of the display device;
>
> (e) employing an input control means to enable a user to select graphical representations from those displayed and to move the selected graphical representations into or from the predetermined area;
>
> (f) employing re-arranging means, responsive to a user movement of a graphical representation from a first location on the display device to a second location on the display device, to re-arrange the graphical representations on the display device to allow the insertion and display of the graphical representation in the second location;
>
> (g) determining new initial values for the input variables of the model application, based on the values of the input variables of each state of the model represented by a displayed graphical representations in the predetermined area;
>
> (h) employing the modification means to alter the new initial values within predetermined limits;
>
> (i) inserting such altered values into the modeling application to cause a new state of the model to be generated;
>
> (j) repeating steps (g) to (I) a selected number of times to generate a new set of states of the model;
>
> (k) producing and displaying graphical representations for each state of the model in the new set;
>
> (l) repeating steps from (e) to (k) at user's request.

If a multiprocessor system is being used, steps (j) is modified such that steps (g) and (h) are repeated a selected number of times to produce a new set of altered values, and step (I) is performed simultaneously on a plurality of processors to enable the new set of states of the model to be generated in parallel. By this approach, the performance of the system can be enhanced.

BRIEF DESCRIPTION OF THE DRAWINGS

The present invention will be described further, by way of example only, with reference to an embodiment thereof as illustrated in the accompanying drawings in which.

DESCRIPTION OF THE PREFERRED EMBODIMENT

In the preferred embodiment, the present invention is used to enhance a standard financial modeling system. The data processing system of the preferred embodiment will now be described with reference to FIG. 1. The standard modeling system consists of the modeling application 150 in which the financial model is defined. The model will typically be defined by a number of equations, variables and constants, such that alteration of the values of the variables will result in a change in the state of the model. An example of such a modeling system would be a spreadsheet application running on an IBM OS/2 environment, provision then being made in the data processing system to allow the spreadsheet application to be interrogated to determine the initial state of the set of variables, to change them and to interrogate the final state of the model as a result of those changes. Examples of suitable spreadsheet applications are Microsoft Excel, Lotus 1-2-3, and Borland's QuatroPro. The modeling application is able to generate data indicative of the state of the model in accordance with the particular values assigned to the input variables. This data is then passed to the display means 140 which produces a graphical representation of each state (also termed an image), for subsequent display on a display device 170 such as a computer monitor. When using a financial modeling application the image typically will be a graph representing the state of the financial model for the particular set of values of the input variables.

Figure 1:
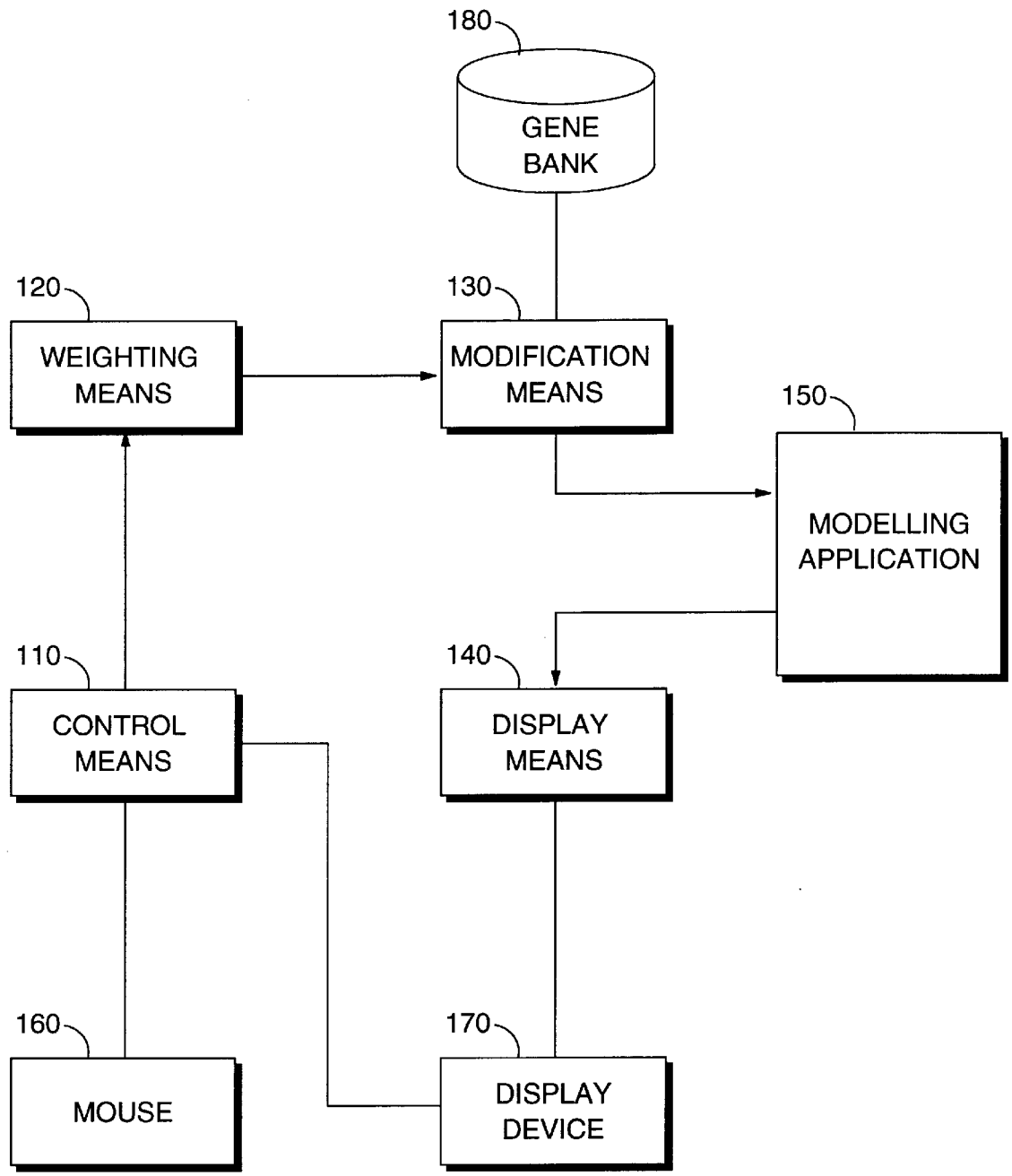
FIG. 1 is a simple block diagram of a data processing system according to the preferred embodiment of the invention.

When the modeling application is being operated in its standard mode (i.e.,. mutation facility is not being used) then only some of the elements in FIG. 1 are used. The input variables are entered directly into the modeling application 150, and a new state is created by the modeling application. The model display means 140 then sends data based on this new state to the display device 170 for presentation to the user.

When the user chooses to apply the mutation facility of the data processing system then all the elements in FIG. 1 are utilized. The modification means 130 is able to read input variables from, and insert values for input variables into, the modeling application 150. In the preferred embodiment the user of the system would set the limits within which the value of each input variable can be adjusted by the modification means 130, and would further set the maximum step by which the values are adjusted.

The modification means 130 reads the initial values of the input variables from the modeling application 150, and then stores these values in the gene bank 180. Further the display means 140 will produce a graphical representation based on the state of the model for display on the display device 170. This data may be sent to the display device straight away so that the graph corresponding to the initial state of the model is displayed without delay, or alternatively the data can be stored for subsequent transmission to the display device 170.

Once this has been done the modification means 130 will adjust the input variables within the limits set earlier by the user, and store the adjusted values in the gene bank 180; these adjusted values will hereafter be referred to as gene values. The new adjusted values are then inserted into the modeling application 150 to effect a new state of the model. The model display means 140 then creates graphical representation data based on this new state and this is also sent to the display device or stored with the earlier data for subsequent transmission to the display device.

The modification means 130 repeats this mutation process a number of times until a selected number of states of the model have been created. Then the complete set of data representing all the graphical representations for the generated states is sent to the display device by the display means 140 (if they have been stored rather than immediately displayed) so that all of the graphs are displayed simultaneously.

For more information about this mutation process, reference should be made to the above referenced European Patent Application EP 0,628,918.

Figure 2A:
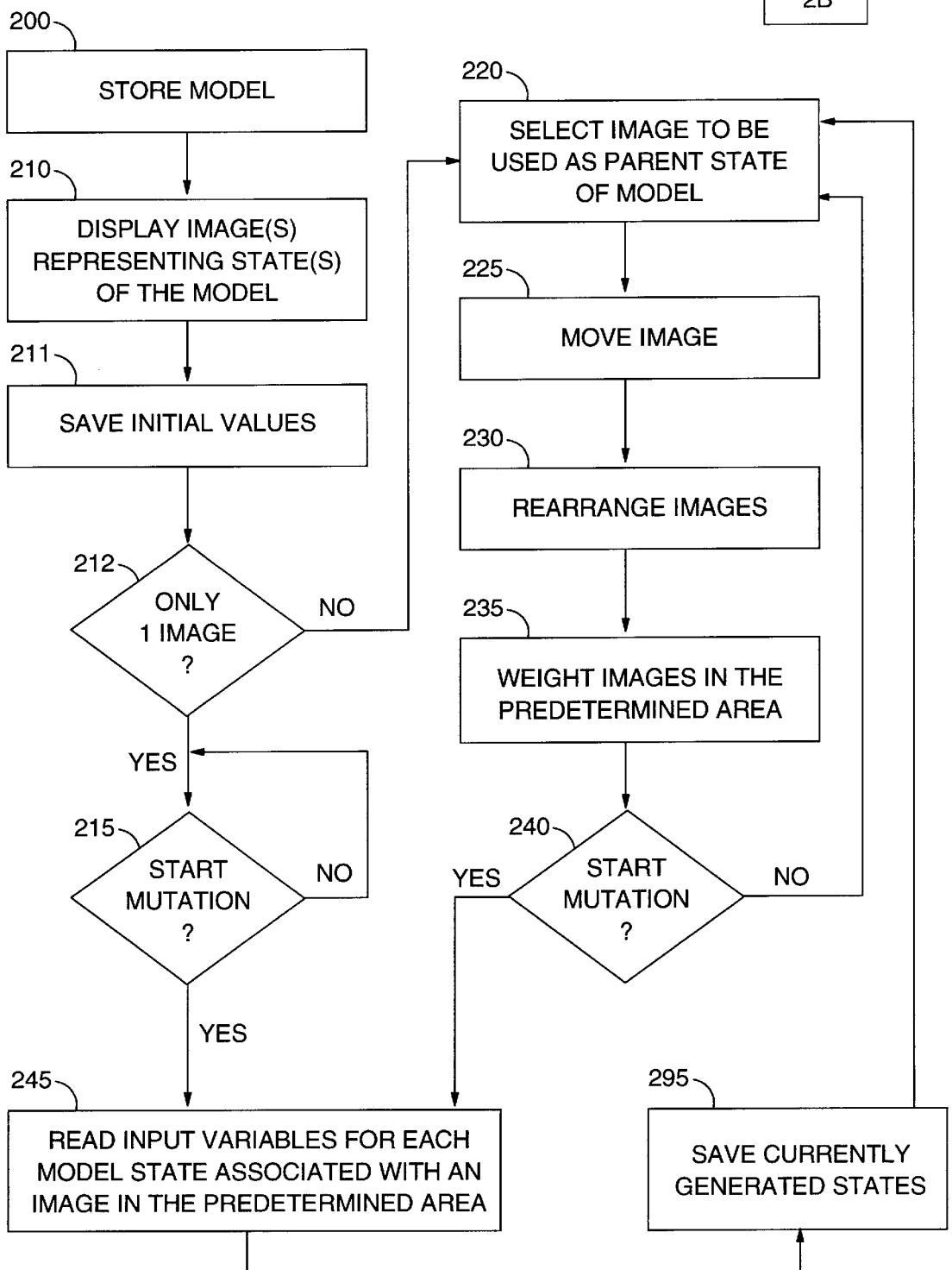
FIGS. 2A and 2B illustrate a flow diagram illustrating the method of operation of the preferred embodiment of the present invention.
Figure 2B:
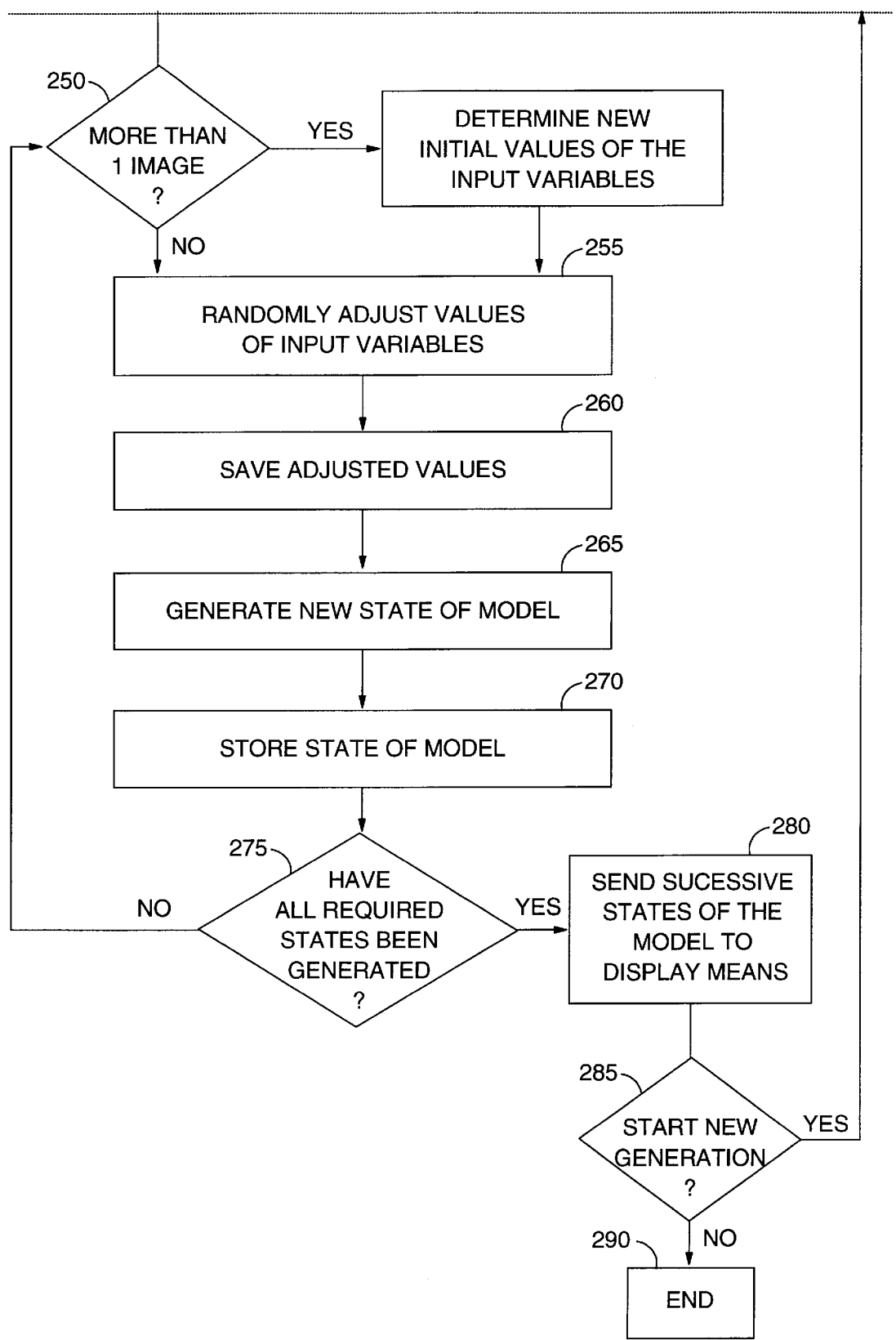
Figure 3A:
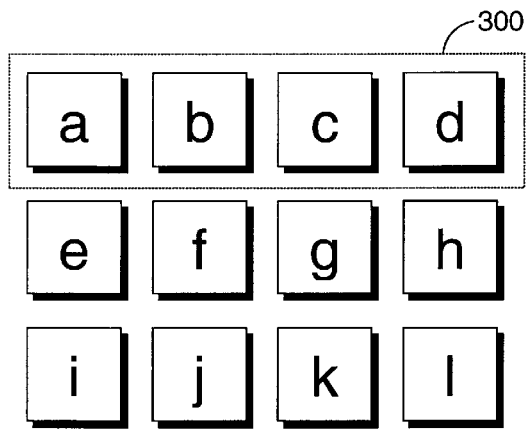
FIGS. 3A, 3B, 3C, 3D and 3E show a set of display layouts for the mutated images in accordance with the preferred embodiment of the invention.

When the set of images have been displayed on the display device, such as images a-1 shown in FIG. 3A, the user then needs to determine which images, and hence which states of the model, will be used as parents for a subsequent mutation process. To do this the user can use the control means 110 to subjectively identify an image as being of interest, using a selection device, most likely a mouse pointer 160, and to then move the selected image to a predetermined area 300 of the screen. The area 300 is intended to contain all graphical representations that the user wishes to be used as parents in the subsequent mutation process. As this is done, the images are re-arranged based on the position in which a selected image is placed by the user, and weighting values are assigned to all images in the predetermined area 300 based on their position within the area 300. This process will be described further with reference to FIG. 2.

In a preferred embodiment the predetermined area 300 is arranged to contain the whole top row of images, this arrangement providing a clear display of the selected graphical representations. Typically four images, from a display of four columns and three rows, are placed within the area 300.

To define the way in which the images within the predetermined area 300 will affect the following mutation, a different weight is automatically assigned to each of these images by weighting means 120. As will be discussed in more detail later, each assigned weight is dependent on the order in which such images are inserted and then displayed within the predetermined area.

When the graphical representations in the predetermined area 300 are those desired by the user, the user can then indicate that a subsequent iteration of the mutation process should be performed. The modification means 130 then selects the initial values to be used for the generation of the child states by a 'marry' operation, with the states represented by images in the predetermined area being used as parents. Various forms of marry operation may be used to generate each child. In one form each initial value is selected from the corresponding gene value of one of the parents, with one independent random selection of the parent for each gene. This selection is affected by the weighting values associated with each parent. For instance, if we assume that the predetermined area 300 contains four parents, and the random function used for the selection of the parent can generate 10 different values, a suitable approach is for the required gene to be taken from the best parent for the random values 1, 2, 3, and 4, from the second choice for 5, 6, and 7, from the third choice for the values 8 and 9, and from the last choice only for the value 0. Other possible approaches will be apparent to those skilled in the art.

Once the initial values have been selected, then modification means 130 takes the initial values of the input variables, adjusts them within the limits set earlier by the user, and stores the adjusted values or gene values in the gene bank 180. Then the new adjusted values are inserted into the modeling application 150 to effect a new state of the model. Next, as previously described, the display means 140 either sends graphical representation data based on each new state to the display device as that state is generated, or stores the data with the other data representing previous states of the model for subsequent transmission to the display device.

The modification means 130 repeats this mutation process a number of times to cause the modeling application to generate the selected number of states of the model to be displayed as already disclosed. In preferred embodiments, the parent states are retained in the predetermined area 300, and child states are generated to fill the remaining positions on the screen.

Referring now to FIG. 2 the method of operation of the data processing system of the preferred embodiment will be described.

At step 200 a model is defined and stored in the modeling application, which as already described uses a set of input variables to control the state of the model. As an example the model could be that of a sales forecast for a multinational company on the open market, and could be defined in a Lotus 1-2-3 spreadsheet application. In the preferred embodiment the user of the system would set the limits within which the value of each input variable can be adjusted by the modification means 130, and would further set the maximum step by which the values are adjusted.

At step 210 the starting state of the model is retrieved from a storage device, or produced directly by the modeling application 150, and is then displayed as an image on the computer display. In the following example, this provides the user with one image which represents a particular state of the model as defined by a set of initial values for the input variables. Usually, at this stage of the process, the user is provided with only one image and preferably it will be displayed in a predetermined area 300 of the display. However more than one image can be displayed, for instance when the results of a previously stored mutation process are to be used as the starting point for mutation.

Then at step 211, the values of the input variables for each displayed image are saved in the gene bank 180. At step 212 the number of the displayed images is checked. If only one image has been shown on the screen then the process passes to step 215 wherein a test is executed to check if the user wants to start the mutation process. The process will wait at step 215 until the user starts the mutation and then the control will pass to step 245.

When more than one image is displayed on the display device 170, for example as shown in FIG. 3A, then from test 212 the control passes to step 220, wherein the user, who is viewing the images displayed on the display (e.g. images a-l in FIG. 3A), identifies an image as being of interest, using a selection device, most likely a mouse pointer.

Figure 3D:
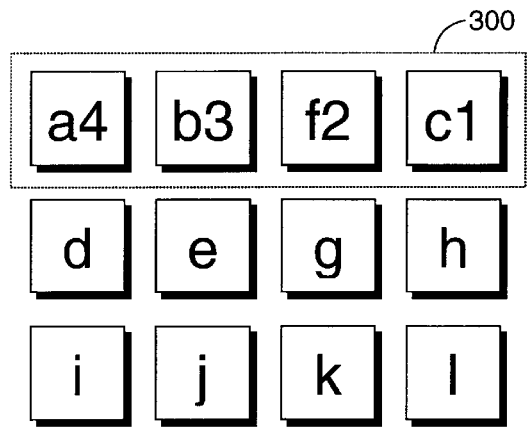
Figure 3B:
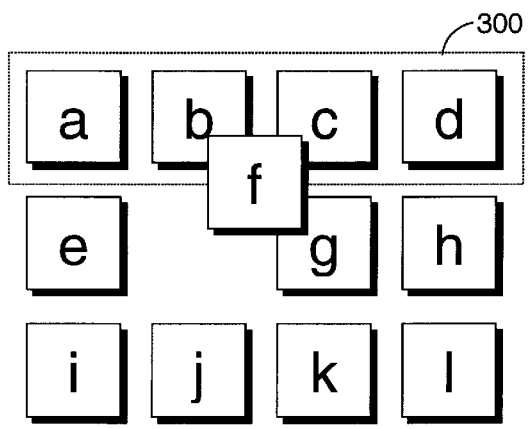

Then, at step 225 the identified image, for instance the image 'f' as shown in FIG. 3B, is moved to the predetermined area 300 of the display. Several well known techniques can achieve this goal, for example in one embodiment the image 'f' and the gap between 'b' and 'c' can be selected for performing the subsequent moving of 'f' between 'b'0 and 'c'. Preferably, the image 'f' is dragged and dropped somewhere in the gap between images 'b' and 'c'. In the same way any of the displayed images may be dragged into any slot to cause the system to re-arrange the order of the images based on the positioning by the user. This activity does not need to be performed accurately, since the image is slotted into the nearest gap and the other images are shuffled as required.

Figure 3E:
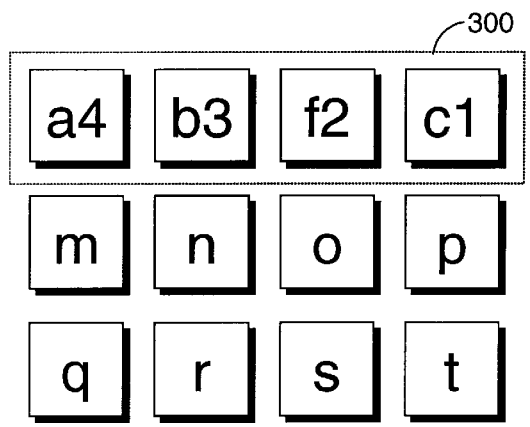
Figure 3C:
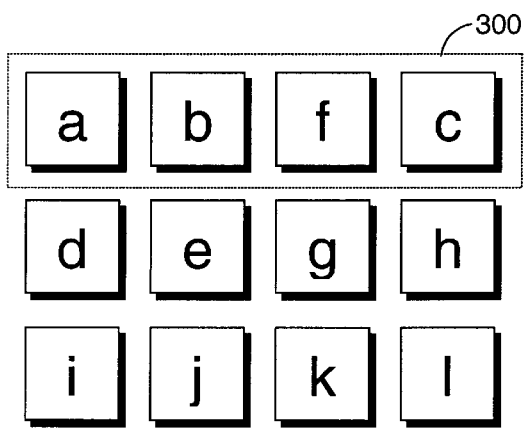
Figure 4A:
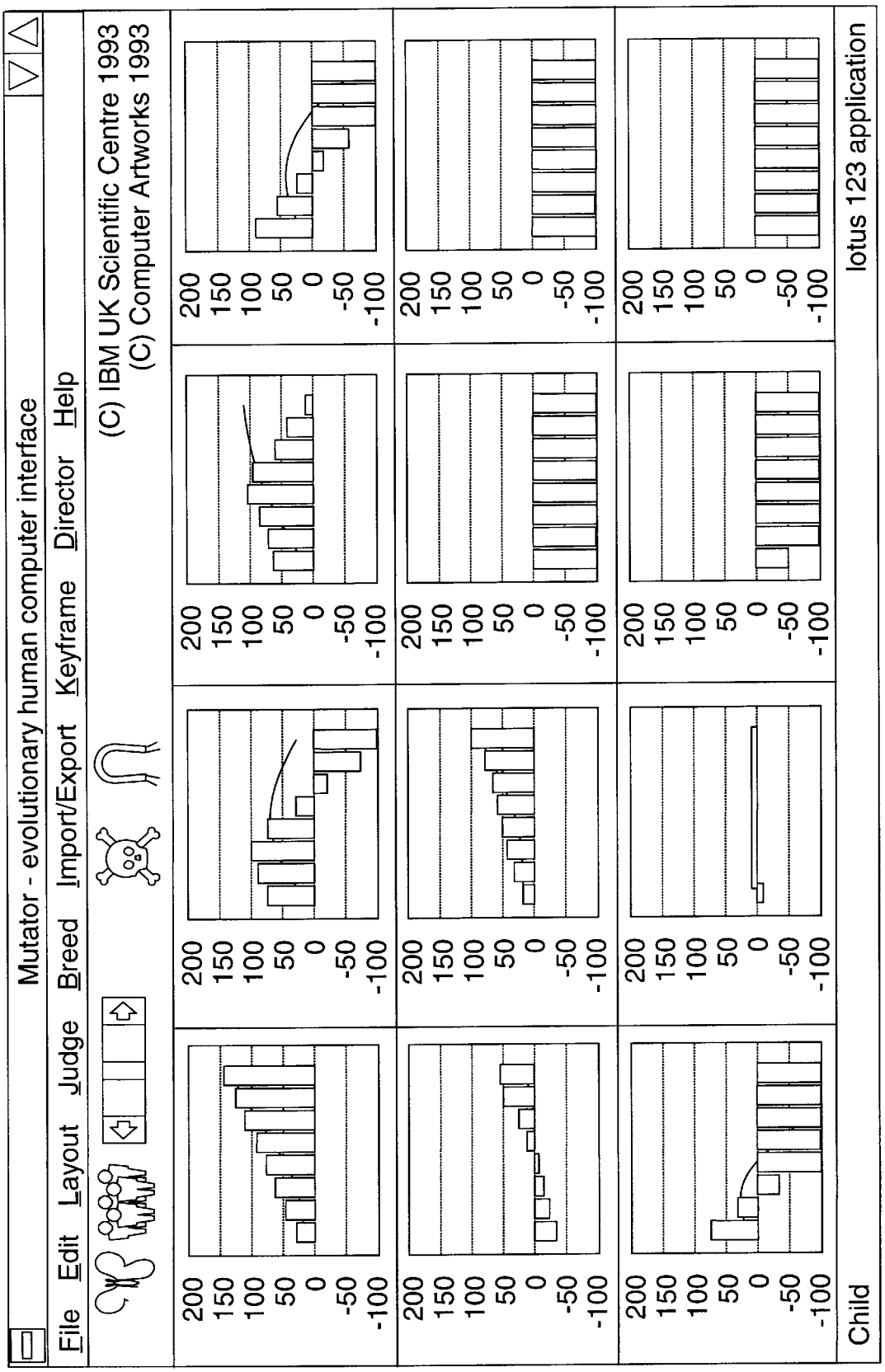
FIGS. 4A, 4B, 4C, 4D and 4E represent a possible set of mutated images in accordance respectively with FIGS. 3A, 3B, 3C, 3D and 3E.
Figure 4B:
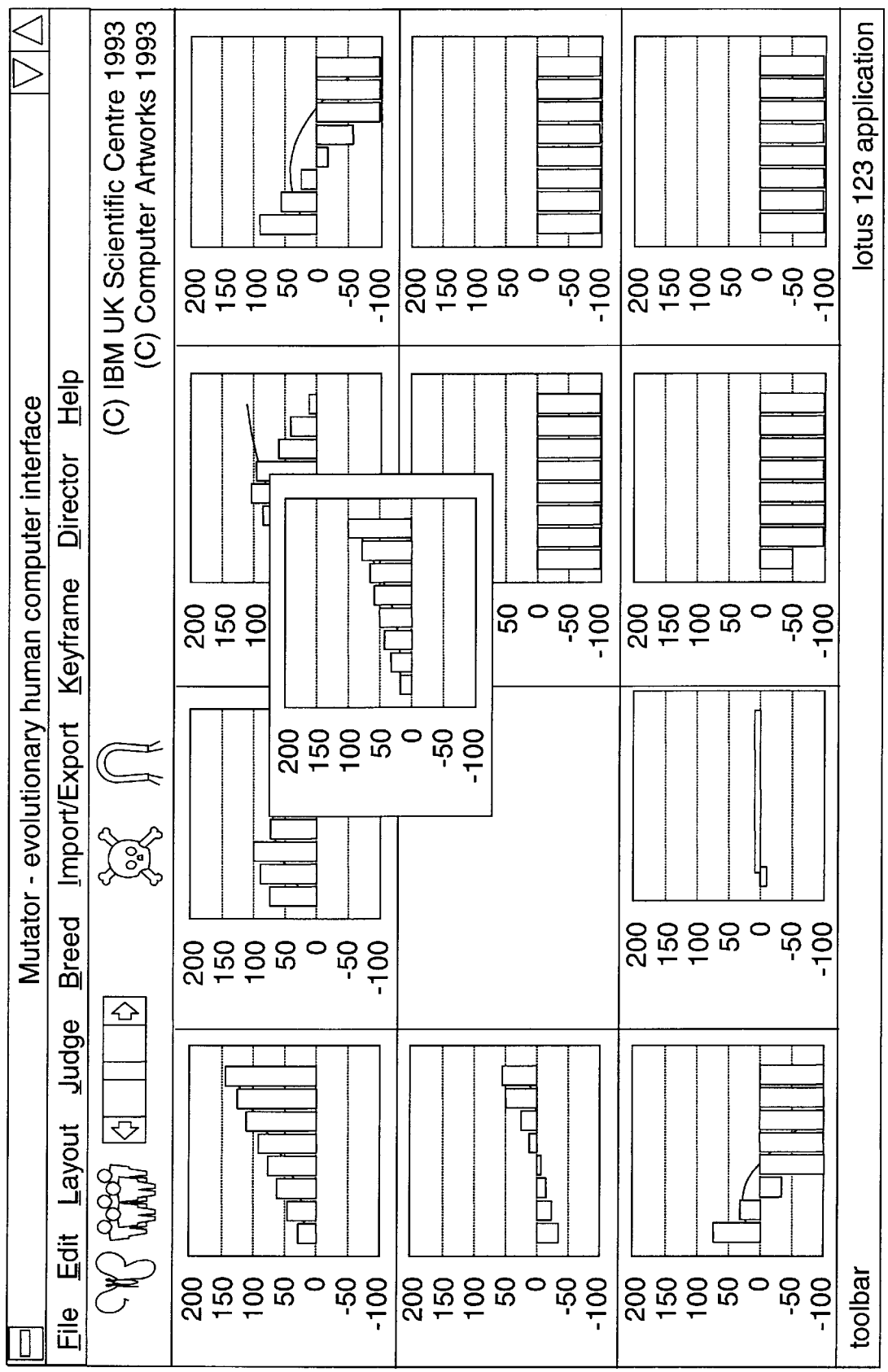
Figure 4C:
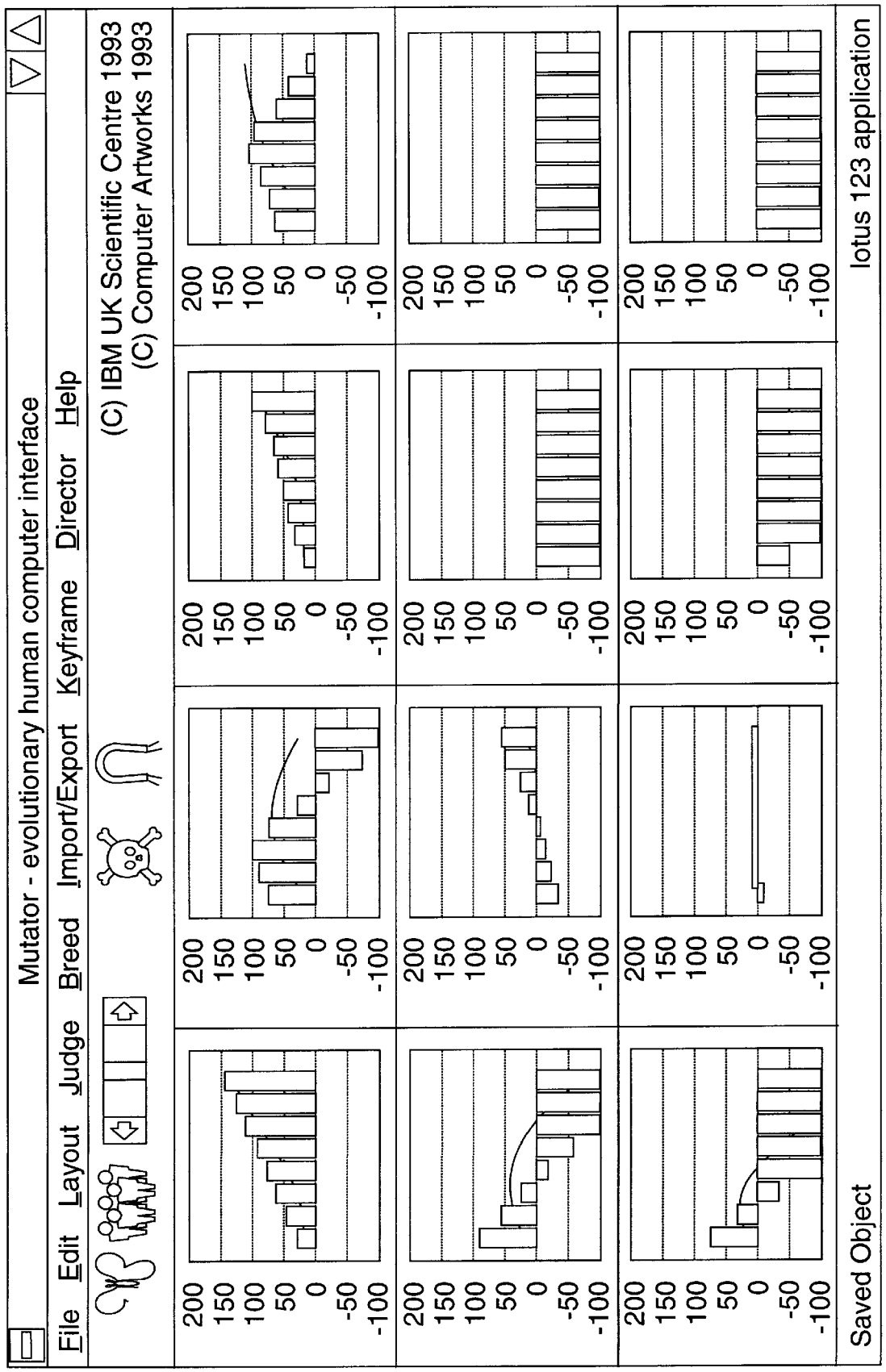
Figure 4D:
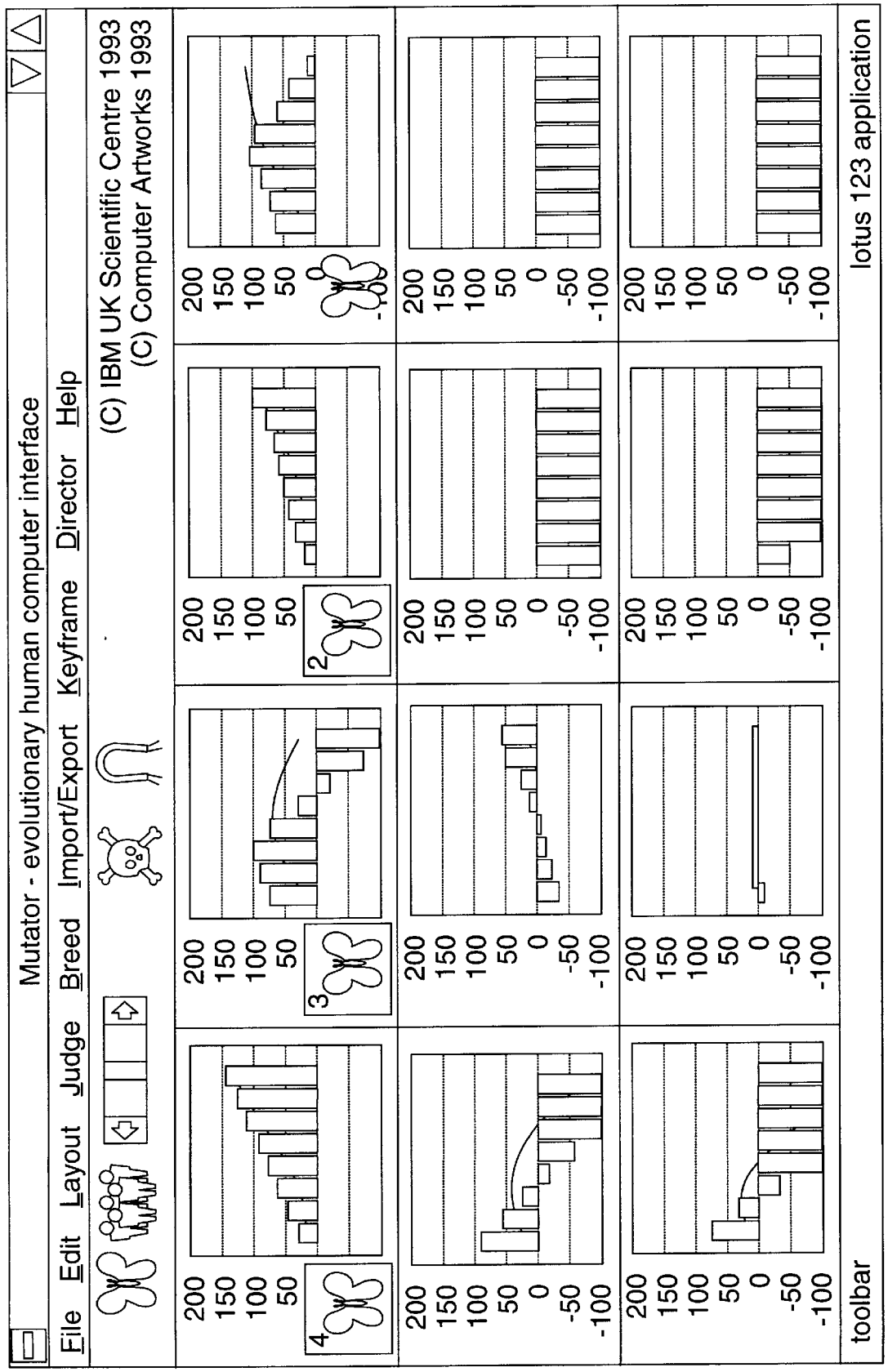
Figure 4E:
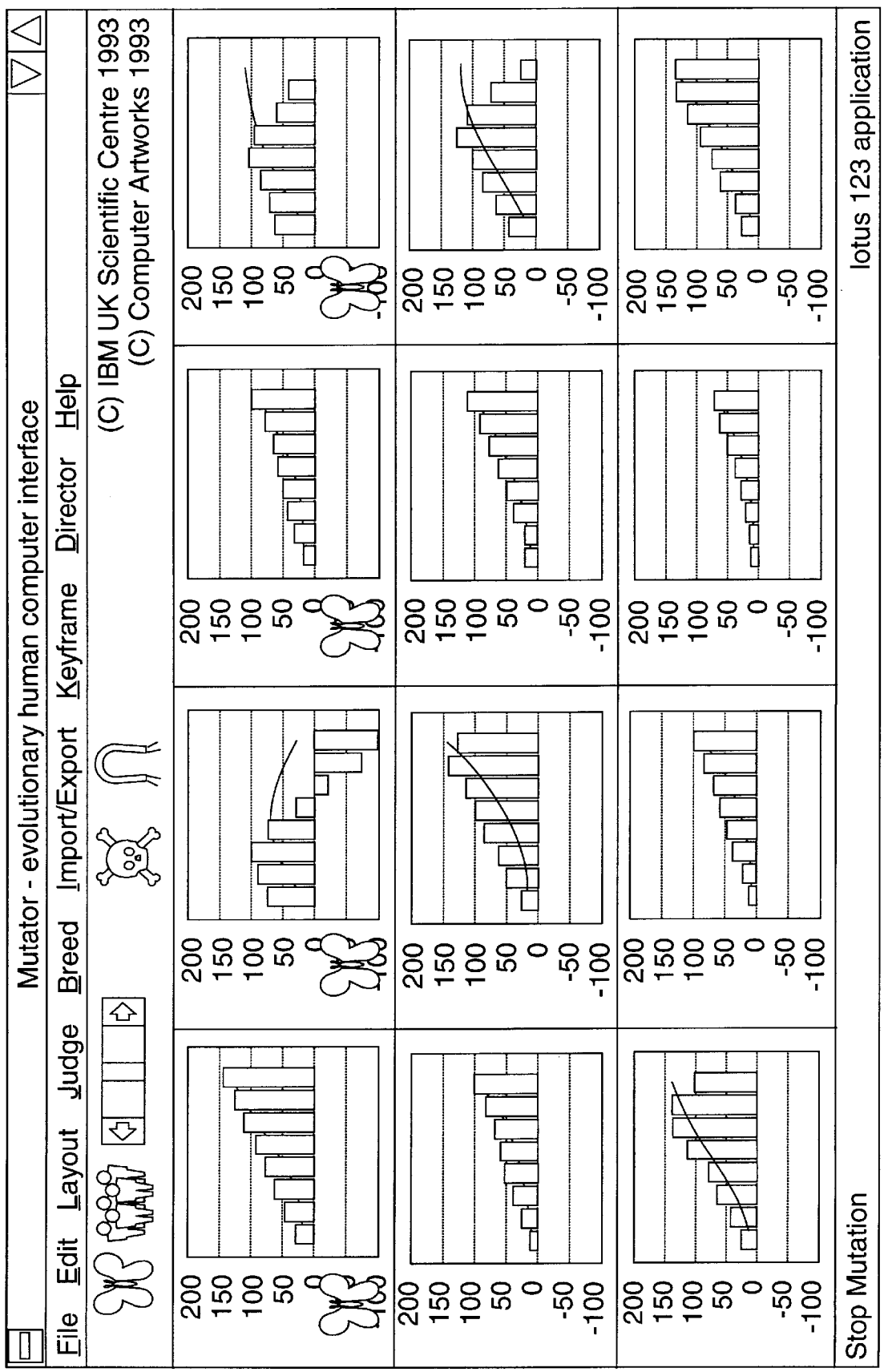

At step 230 all the displayed images are re-arranged, as shown in FIG. 3C, causing, for example, the insertion of the image 'f' between the images 'b' and 'c' and movement of the image 'd' out of the predetermined area 300. In this way the user can easily identify which are the selected images and consequently the physical proximity of the objects makes it easier to judge if such states best represent what he/she is looking for and if they are in the appropriate order of preference.

At step 235, weighting means 120 automatically identifies images in the predetermined area 300 and gives them weights, for example assigning the values 4, 3, 2, 1 to such images from left to right as shown in FIG. 3D, the order of the remaining images being of no importance. At the same time if any of the images previously in the area 300 has been moved out by the user selection, then its previously assigned weight is reset to zero. However any other method suitable to assign ranking preferences to the parents can be adopted.

By these user-friendly activities of dragging and dropping images, the user is encouraged to perform all the selections and the ranking required in order to operate a more effective new generation of states. At step 240, a check is made to see if the user wants to start the mutation. If NOT the process above is repeated returning to step 220 as many times as the user desires to reorder the images. Otherwise, if the user indicates that a mutation should occur, the generation process starts at step 245.

At step 245 the modification means 130 reads form the gene bank 180 each vector of input variables for the model state associated with each displayed image in the predetermined area 300, thereby forming a matrix of initial values. If only one image is displayed in the area 300 only one vector of initial values will have been retrieved from the modeling application and saved for a subsequent use.

A test 250 is now performed to check how many states will affect the following state generation, i.e.,. how many images are contained in the area 300. If there is only one image, the process passes directly to step 255; otherwise step 253 is executed. At step 253, for each input variable in the model, a random function generates a number which correlates to one of the images, in accordance with its weighting value, the image to which the number correlates being the image from which the required gene will be retrieved. The generation of numbers will be repeated until a complete vector of values has been determined for the input variables of the modeling application, and then the vector is saved (the above process is referred to as a 'marriage' operation).

At step 255 the modification means 130 performs a mutation process to adjust the values contained in the saved vector within the limits set earlier by the user. The saved vector will contain either the initial values associated with the single image displayed in the predetermined area 300 or the values generated at step 253, depending on the flow of the process. The modification means 130 stores, at step 260, the so adjusted values or gene values in the gene bank 180. Then at step 265 the gene values are retrieved from the gene bank 180 and inserted into the modeling application 150 to generate a new state of the model. The generated data describing this new state is now stored at step 270 for a subsequent transmission to the display device 170. In another embodiment this data can be directly sent to the display device 170 for an immediate display of the generated state.

A test 275 is then performed to check if all the required states of the model have been generated. If the generation of a new state is required test 275 passes the control to step 250 wherein the generation process for a new state of the model re-starts, continuing as previously described in order to generate all the required remaining states.

It should be noted that, if a multiprocessor environment is employed, some steps of the mutator process, particularly steps 265 and 270, can be run simultaneously on a plurality of processors to effect a parallel mode of operation, and hence improve the speed of operation. For example one processor can be used to produce as many saved vectors, each one containing a different set of adjusted values, as necessary to generate all the required states of the model (steps from 250 to 260). Then, the state generation steps 265 and 270 can be run in parallel on a plurality of the available processors in order to generate the new states of the model. Hence, when the saved vectors have been produced, they are passed to available processors, each of which runs a copy of the modeling application in order to generate and store a state based on the adjusted values contained within the vector received. Indeed this parallel state generation process can be started before all the vectors have been produced, and then the processor which was producing the vectors can also be used for state generation when the required number of vectors have been produced. To increase efficiency, standard load balancing techniques can be used to get maximum possible parallelism.

Returning to step 275, if all the required states have been generated, then in step 280 data representing each state of the model stored in step 270 is sent to the display device 170 by the display means 140 and is displayed as shown in FIG. 3A.

Typically a user, after the first iteration, can repeat the mutation process as many times as he likes to reach a satisfying result. if the user decides that his earlier judgements were wrong he can 'back out' through the various level of mutation, and then restart from a desired point. A test 285 is performed to check if the user wants to re-starts the process for a new mutation or not. If NOT the process ends at step 290, otherwise at step 295 the present set of mutated states is preferably saved for a possible future use and then the control passes to step 220.

A typical example is illustrated in FIGS. 3D and 3E. In FIG. 3D a set of 12 images is displayed on the display 170 and a subset of 4 images is selected as identifying the parents for the subsequent generation of states of the model. In FIG. 3E 8 new states are displayed on the screen maintaining the parents' subset unchanged. This means that in such an example a production of 8 new states of the model is required.

In a preferred embodiment at step 280 not all the displayed images are newly generated, but instead the current parent(s) of the new states (i.e., the single initial state or the images displayed within the area 300 before the start of the current generation at step 245) are displayed within the area 300 and new child states are generated to fill the remaining positions on the display.

Referring now to FIGS. 4A–4E, they depict a possible set of mutated images displayed on the display device 170. FIGS. 4A–4E correspond to the display layouts illustrated in FIGS. 3A–3E.

From the above description, it can be seen that a system according to the preferred embodiment of the present invention encourages the user to perform more selections of potential parents, thereby making more effective use of the mutator system. The system automatically displays a plurality of graphical representations in the predetermined area, prior to any direct selection by the user, and this urges the user to complete his/her choice if the automatic selection is not desired. Further, the drag and drop mechanism provided in preferred embodiments of the present invention assists the user in making selections, since the drag and drop process is intuitive and easy to use. Additionally, a weighting means provided in preferred embodiments of the present invention automatically assigning a weighting to each graphical representation within the predetermined area, this weighting being dependant on the position of the graphical representation within the predetermined area. The modification means then also takes into account the weighting of each state of the model represented by a graphical representation in the predetermined area when producing said altered input variables. The physical proximity of the best choices in the predetermined area make it easier for the user to see the choices he/she has made, and to then reorder them to perform a ranking among them.

I claim:

1. A data processing system for generating states of a model, the model being defined within a modeling application and having a plurality of input variables associated therewith, the modeling application being arranged to generate a state of the model based on values of the input variables, the system comprising:

modification means for altering the values of the input variables, and for providing the altered values to the modeling application to cause a new state of the model to be generated, said modification means being arranged to repeat a selected number of times a production of altered values thereby causing a set of states of the model to be generated by the modeling application;

display means for producing a graphical representation of each of the states of the model in the set and for displaying the graphical representations on a display device connectable to the data processing system, said display means being arranged to display a plurality of the graphical representations;

input control means, responsive to signals received from an input device connectable to the data processing system, to enable a user to select at least one graphical representation from the displayed graphical representations and to move the selected graphical representations into or from a predetermined area of the display device;

graphical representation re-arranging means, responsive to the user moving the at least one graphical representation from a first location on the display device to a second location within the predetermined area on the display device, for re-arranging the displayed graphical representations on the display device to allow insertion and display of the moved graphical representation in the second location;

said modification means being responsive to the values of the input variables of each of the states of the model represented by one of the graphical representations in the predetermined area of the display device, to produce altered input variables for a subsequent set of states of the model;

the data processing system being arranged to repeat generation of the set of states of the model, and to display graphical representations of those states.

2. A data processing system as claimed in claim 1, further comprising weighting means for automatically assigning a weighting to each of the graphical representations within the predetermined area, the weighting being dependant on a position of each of the graphical representations within the predetermined area; the modification means being also responsive to the weighting of each state of the model represented by one of the graphical representation in the predetermined area when producing said altered input variables.

3. A data processing system as claimed in claim 2, wherein the weighting means automatically assigns the weighting to each of the graphical representations within the predetermined area each time a changing of the position of the graphical representations occurs within the predetermined area.

4. A data processing system as claimed in claim 1, wherein, when one of the graphical representations is moved from the first to the second location, the other graphical representations are re-arranged by shifting the graphical representations between the first location and the second location one location towards the first location, thereby making available the position corresponding to the second location for insertion and display of said one of the graphical representations.

5. A data processing system as claimed in claim 4, wherein the second location, if not within a gap, is automatically associated with the nearest gap, the gap being any free space between two graphical representations or between one graphical representation and the frame of the predetermined area.

6. A data processing system as claimed in claim 2, wherein the weighting means automatically downgrades the moved graphical representation when it is moved out of the predetermined area.

7. A data processing system as claimed in claim 1, wherein during a generation of a subsequent set of states, the selected graphical representations from a previous generation of states are retained in the predetermined area, thereby allowing comparison of the graphical representions of the states in the subsequent set of states with the selected graphical representions from the previous generation of states.

8. A method of operating a data processing system to generate states of a model, comprising the steps of:

(a) storing the model in a modeling application, the model having a plurality of input variables associated therewith;

(b) altering the values of the input variables and providing the altered values to the modeling application to cause a new state of the model to be generated, the state of the model being based on the values of the input variables, this step being repeated a selected number of times to cause a set of states of the model to be generated;

(c) producing a graphical representation for each state of the model in the set;

(d) displaying the graphical representations on a display device;

(e) employing input control means to enable a user to select graphical representations from the displayed graphical representations and to move the selected graphical representations into or from a predetermined area of the display device;

(f) employing graphical representation re-arranging means, responsive to the user moving one of the graphical representations from a first location on the display device to a second location within the predetermined area of the display device, to re-arrange the graphical representations on the display device to allow insertion and display of the moved graphical representation in the second location;

(g) determining new initial values for the input variables of the modeling application, based on the values of the input variables of each state of the model represented by a displayed graphical representation in the predetermined area;

(h) employing modification means to alter the new initial values within predetermined limits;

(i) inserting such altered values into the modeling application to cause a new state of the model to be generated;

(j) repeating said steps (g) to (i) a selected number of times to generate a new set of states of the model;

(k) producing and displaying graphical representations for each state of the model in the new set; and (l) repeating said steps (e) to (k) at a user's request.

9. A method as claimed in claim 8, wherein, in a multi-processor system, said step (j) is modified such that said steps (g) and (h) are repeated a selected number of times to produce a new set of altered values, and said step (i) is performed simultaneously on a plurality of processors to enable the new set of states of the model to be generated in parallel.

10. A method as claimed in claim 8, further comprising, prior to said step (g), the step of (m) employing a weighting means to automatically assign a weighting to each graphical representation within the predetermined area, the weighting being dependant on a position of the graphical representation within the predetermined area, wherein said step (g) then uses the weighting assigned to the graphical representations within the predetermined area when determining the new initial values.

11. A method as claimed in claim 10, wherein said step (m) is repeated each time a changing of the position of the graphical representations occurs within the predetermined area.

12. A method as claimed in claim 8, wherein said step (f) further comprises shifting the graphical representations between the first location and the second location one location towards the first location, thereby making available a position corresponding to the second location for insertion and display of the moved graphical representation.

13. A method as claimed in claim 10, wherein said step (m) further comprises automatically downgrading each graphical representation when it is moved out of the predetermined area.

14. A method as claimed in claim 8, wherein, when executing said steps (g) to (k), the selected graphical representations from a previous generation of states are retained in the predetermined area, thereby allowing comparison of the graphical representations of the states in the subsequent set of states with the selected graphical representations from the previous generation of states.

* * * * *

UNITED STATES PATENT AND TRADEMARK OFFICE
CERTIFICATE OF CORRECTION

PATENT NO. : 5,862,364
DATED : January 19, 1999
INVENTOR(S) : Stephen James Paul Todd It is certified that error appears in the above-identified patent and that said Letters Patent is hereby corrected as shown below:

Column 11, Line 13

Please change "predetennined" to -- predetermined --.

Signed and Sealed this

Fifteenth Day of June, 1999

Attest:

Q. TODD DICKINSON

Attesting Officer

Acting Commissioner of Patents and Trademarks